United States Patent
Rahut et al.

(10) Patent No.: US 7,051,312 B1
(45) Date of Patent: May 23, 2006

(54) UPPER-BOUND CALCULATION FOR PLACED CIRCUIT DESIGN PERFORMANCE

(75) Inventors: Anirban Rahut, San Jose, CA (US); Sudip K. Nag, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 338 days.

(21) Appl. No.: 10/603,219

(22) Filed: Jun. 24, 2003

(51) Int. Cl.
*G06F 17/50* (2006.01)

(52) U.S. Cl. .............. 716/13; 716/12; 716/13; 716/14

(58) Field of Classification Search ............. 716/12, 716/13, 14
See application file for complete search history.

(56) References Cited

U.S. PATENT DOCUMENTS

| | | | | |
|---|---|---|---|---|
| 5,237,514 | A * | 8/1993 | Curtin | 716/10 |
| 5,659,484 | A * | 8/1997 | Bennett et al. | 716/16 |
| 6,058,252 | A * | 5/2000 | Noll et al. | 716/10 |
| 6,591,407 | B1 * | 7/2003 | Kaufman et al. | 716/10 |
| 6,763,506 | B1 * | 7/2004 | Betz et al. | 716/6 |
| 6,766,504 | B1 * | 7/2004 | Rahut et al. | 716/13 |
| 6,782,520 | B1 * | 8/2004 | Igusa et al. | 716/9 |
| 2002/0124230 | A1 * | 9/2002 | Cai et al. | 716/6 |
| 2004/0250226 | A1 * | 12/2004 | Lin et al. | 716/7 |

OTHER PUBLICATIONS

Donath et al. "Timing Driven Placement Using Complete Path Delays", 27th ACM/IEEE Design Automation Confererence, 1990, pp. 84-89.*

* cited by examiner

*Primary Examiner*—Vuthe Siek
*Assistant Examiner*—Tuyen To
(74) *Attorney, Agent, or Firm*—Pablo Meles

(57) ABSTRACT

Within a computer automated tool, a method (400) of estimating an upper-bound of an operational frequency of at least a portion of a placed circuit design can include identifying (405) a clock source within the placed circuit design, wherein the clock source is associated with a clock domain, and determining (410) an initial routing of the clock domain. The method also can include determining (420) a minimum path slack corresponding to each connection of the clock domain. Connections of the clock domain which have a lowest minimum path slack can be marked (430). One or more marked connections which are not routed in delay mode can be identified and routed in delay mode (455) allowing sharing of routing resources by different nets.

34 Claims, 3 Drawing Sheets

UPPER-BOUND CALCULATION FOR PLACED CIRCUIT DESIGN PERFORMANCE

BACKGROUND

1. Field of the Invention

The present invention relates to the field of physical design and, more particularly, to predicting upper-bound performance of a placed circuit design.

2. Description of the Related Art

Software based logic simulation and design tools presently are capable of performing functional and timing simulations for digital electronic designs which are written in a hardware description language such as Very High Speed Hardware Description Language (VHDL) or Verilog. Hardware description languages permit hardware designers to define signals at a very high level of abstraction. Logic design tools, referred to as electronic design automation or computer design automation tools (design tools), can specify circuit component placement as well as signal routing between placed components for a given circuit design. The abstracted signal representations can be translated to actual pins and circuitry on a microchip using any of a variety of commercially available fabrication and/or design tools.

One of the crucial tasks in the flow of implementing a design from a high level language like VHDL to actual layout is placement. Placement essentially assigns coordinate locations in an abstract grid to the blocks or components and the pins of the components. The objective of the placement phase, which can be performed by a design tool or a design tool component referred to as a placer, is to assign locations such that signals can be routed using minimal resources and/or with minimal delay governed by the design constraints.

A routing tool or routing tool component can follow the placer in the implementation flow. Given a set of pin locations, the router connects the signals together such that the design constraints are met. Generally, two modes of routing can be performed—a "resource" mode routing or a "delay" mode routing. In resource mode, signals are routed using a minimum number of resources. In contrast, delay mode routing routes a connection of a signal such that the route with minimal delay is attained for that connection. Since delay mode routing optimizes delay, a connection routed in delay mode cannot be further optimized in terms of signal propagation delay.

A useful metric within the context of design tools and circuit designs in general is an upper-bound determination of the achievable performance of a placed circuit design. The upper-bound provides an indication of the achievable performance for a given, placed circuit design in terms of the highest attainable clock frequency of the placed circuit design, or a portion thereof. The performance of a placed circuit design, or of a particular segment or clock domain, is dictated by the time required for a signal to propagate though a path, or from a driver register to a load register. Signals must propagate from one clocked register to the next in a time which is less than the period of the clock frequency that governs the driver and load registers of that path. Thus, the performance for a given, placed circuit design, or segment thereof, is defined by the path requiring the most time for a signal to propagate from one clocked node to another.

In the absence of a practical and efficient manner of estimating upper-bound performance, estimating the performance of a placed circuit design requires the design tool to actually determine connection routings of the placed circuit design and then analyze the various path delays of the routed design. Accordingly, a designer's options have been limited to allowing the design tool to complete the delay-aware routing process to route every connection of the placed circuit design in delay mode. As modern circuit designs, such as Field Programmable Gate Array (FPGA) designs, can include millions of timing paths and wires and hundreds of thousands of signals, investigating all routing options and evaluating placed circuit design timing can be run time expensive in terms of both the time and computing resources required. This option is not always feasible in light of modern expedited design cycles. In consequence, circuit designers frequently must proceed with circuit design without any such estimate of an upper-bound of placed circuit performance.

What is needed is a technique for predicting a realistic upper-bound on the performance of a placed circuit design which can be performed in a minimal amount of time and, further, provides a generalized solution which can be applied to any of a variety of different placed circuit designs.

SUMMARY OF THE INVENTION

One embodiment of the present invention can include a method of estimating an upper-bound for an operational frequency of at least a portion of a placed circuit design within a computer automated tool. The method can include: (a) identifying a clock source within the placed circuit design, wherein the clock source is associated with a clock domain; (b) determining an initial routing of connections of the clock domain, for example using an overlap-tolerant resource mode; (c) determining a minimum path slack corresponding to each connection of the clock domain; (d) selecting the connections based on minimum path slack; (e) marking the connections of the clock domain which have a lowest minimum path slack; and (f) identifying marked connections which are not routed in delay mode as selected. Accordingly, in step (g), one or more of the selected connections can be routed in delay mode.

According to an alternative embodiment of the present invention, the method can include the step of (h) repeating steps (c)–(g) until all selected connections are routed in delay mode. The connections having the lowest minimum path slack can correspond to a critical path. Accordingly, the method can include the step of (i) determining an upper-bound estimate of clock frequency for the clock domain as defined by a path delay of the critical path.

Step (c) can include assigning to each connection the path slack of the path within which each connection is disposed. Notably, if more than one path passes through a connection, the minimum path slack of all paths passing through that connection can be assigned to the connection. Step (d) can include populating a data structure with the connections of the clock domain and sorting the connections according to the path slack of each connection. It should be appreciated that steps (a)–(i) can be iteratively applied to different clock sources of the placed circuit design, wherein each different clock source is associated with a corresponding and different clock domain.

Another embodiment of the present invention can include a method of estimating an upper-bound for an operational frequency of at least a portion of a placed circuit design within a computer automated tool which includes (a) constraining at least two clock sources within the placed circuit design to a same target frequency, where each clock source is associated with a different clock domain. The method further can include: (b) determining an initial routing of connections of the clock domains, for example using an overlap-tolerant mode; (c) determining a minimum path slack corresponding to each connection of the clock domains; (d) marking connections of the clock domains which have a lowest minimum path slack; (e) identifying marked connections which are not routed in delay mode; and (f) routing one or more of the identified connections in delay mode.

According to an alternative embodiment of the present invention, an additional step (g) can be included wherein steps (c)–(f) are repeated until all marked connections are routed in delay mode. Step (c) can include assigning to each connection the path slack of the path within which each connection is disposed. If more than one path passes through a connection, the minimum path slack of all paths passing through that connection can be assigned to that connection. Step (d) can include populating a data structure with the connections of the clock domains and sorting the connections according to the path slack of each connection.

Another embodiment of the present invention can include a system configured to estimate an upper-bound for an operational frequency of at least a portion of a placed circuit design. The computer automated tool can include means for identifying a clock source within the placed circuit design, wherein the clock source is associated with a clock domain, and means for determining an initial routing of connections of the clock domain. The system also can include means for determining a minimum path slack corresponding to each connection of the clock domain, means for marking connections of the clock domain which have a lowest minimum path slack, means for identifying marked connections which are not routed in delay mode, and means for routing one or more of the identified connections in delay mode. Notably, the connections having the lowest minimum path slack can specify a critical path. Accordingly, the system can include means for determining an upper-bound estimate of clock frequency for the clock domain as defined by a path delay of the critical path.

Still another embodiment of the present invention can include a system configured to estimate an upper-bound for an operational frequency of at least a portion of a placed circuit design including means for constraining at least two clock sources within the placed circuit design to a same target frequency, wherein each clock source is associated with a different clock domain, and means for determining an initial routing of connections of the clock domain. The system also can include means for determining a minimum path slack corresponding to each connection of the clock domains, means for marking connections of the plurality of clock domains which have a lowest minimum path slack, means for identifying marked connections which are not routed in delay mode, and means for routing one or more of the identified connections in delay mode. As noted, the connections having the lowest minimum path slack can specify a critical path. As such, the system can include means for determining an upper-bound estimate of clock frequency for the clock domains as defined by a path delay of the critical path.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a method, system, and apparatus for predicting an upper-bound on performance of a placed circuit design. According to one embodiment of the present invention, connections of selected paths having the lowest path slack can be identified and rerouted if necessary. Reductions in the propagation delay of individual connections can lead to reductions in the path delay for any paths passing through such connections, thereby allowing the clock frequency of a placed circuit design, or a portion of the placed circuit design, to be increased.

Figure 1:
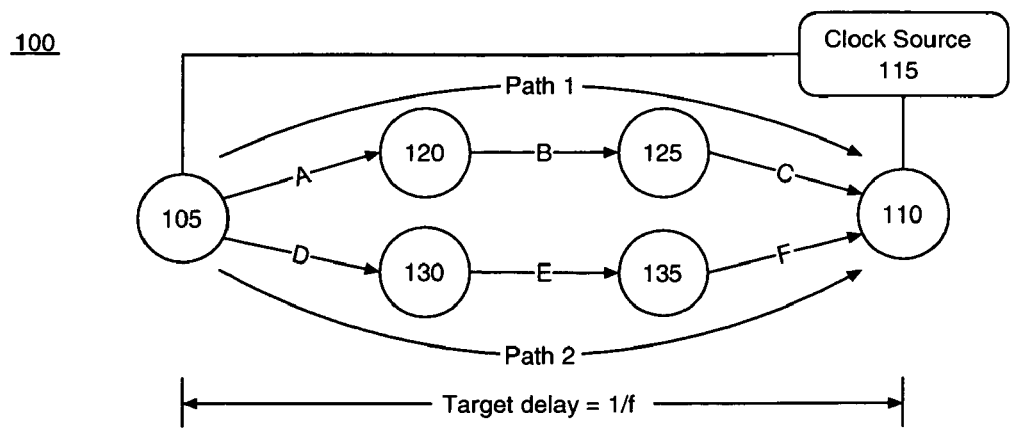
FIG. 1 is a timing graph representing a portion of a placed circuit design which can be processed to predict an upper-bound of performance of the placed circuit design in accordance with one embodiment of the present invention.

FIG. 1 is a timing graph 100 representing a portion of a placed circuit design. The portion of the timing graph 100 shown is driven by a single clock source. The timing graph 100 can be developed using a computer design automation (CDA) tool. More particularly, a developer can use such a tool to develop a placed circuit design using standard component (logic) and interconnect models of the CDA tool. Once the placed circuit design is available, the CDA tool can generate a timing graph, such as timing graph 100.

As shown, the timing graph 100 can include a source node 105 and a target node 110. Notably, both the source node 105 and the target node 110 can be registers or flip-flops which are driven by a clock signal from a single clock source 115. Nodes 120, 125, 130, and 135 of the timing graph 100, which are disposed between the source node 105 and the target node 110, represent a body of logic which is not clocked. That is, the nodes 120, 125, 130, and 135 each operates on a signal when present at that node.

The various nodes of the timing graph 100 form two different paths, namely path 1 and path 2. Path 1 is formed by the chain of connected nodes 105, 120, 125, and 110. The nodes of path 1 are communicatively linked with signal paths or connections A, B, and C which represent circuit interconnections. Similarly, path 2 is formed of nodes 105, 130, 135, and 110, with the nodes being communicatively linked with connections D, E, and F.

From known logic and/or interconnect models, the nodes 105–135 can be annotated with values indicating the time for a signal to be processed by the node or propagate through the node. The logic models used in the placed circuit design, which correspond to nodes, can specify signal propagation times for each node. As similar timing characteristics can be determined with respect to the connections A–F, estimates of the time required for a signal to propagate through path 1 and path 2, from node 105 to node 110, can be determined. Signal propagation times for the various connections linking the nodes can be determined using connection models. Thus, a timing engine function of the CDA tool can be used to traverse the timing graph of a placed circuit design to determine an estimate of the signal propagation time through each path.

The maximum frequency of the clock source 115 is dictated by the time required for a signal to propagate through either path 1 or path 2, from clocked node 105 to clocked node 110, whichever is greater. This time measure for each path is referred to as the path delay. Each path has an associated path delay which accounts for time required for a signal to propagate through each component and connection of a path. As such, if a placed circuit design is to function properly, the path delay of either path 1 or 2 cannot exceed a time of 1/F, where "F" corresponds to the frequency of the clock source 115. The value determined from the expression "1/F" also can be referred to as the target delay, as any logic disposed between two clocked nodes must complete in less than 1/F time, or less than one period of the clock frequency.

Figure 2:
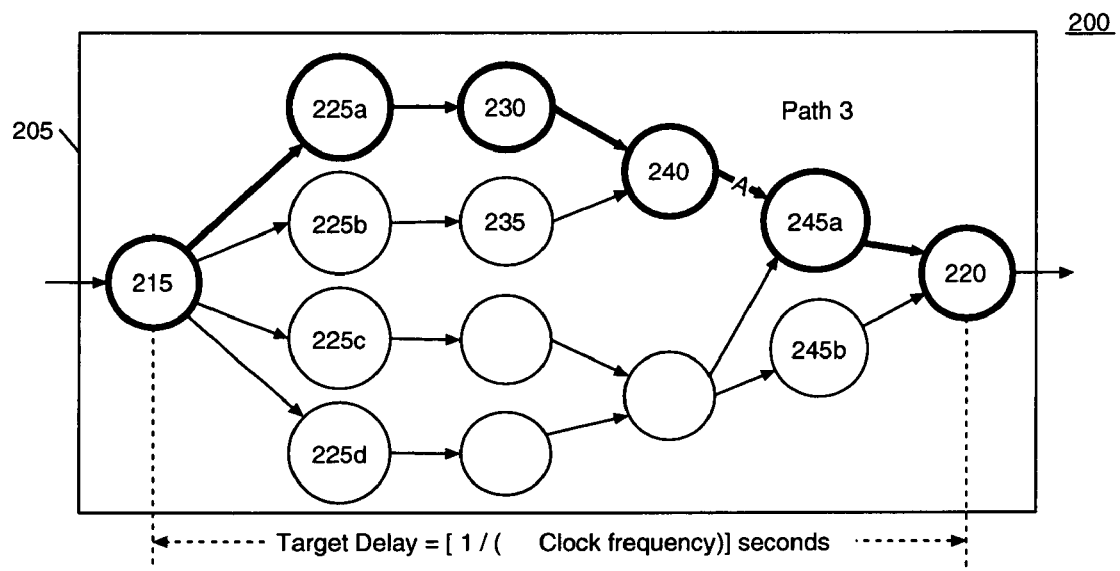
FIG. 2 is a timing graph representing a portion of a more complex placed circuit design in accordance with another embodiment of the present invention.

FIG. 2 is another timing graph 200 representing a portion of a more complex, placed circuit design. A clock domain 205 refers to the group of nodes (or logic) of the timing graph which operate or are governed by a particular clock source, either directly where the node is driven by that clock source, or indirectly such that the nodes are disposed between registers which are driven by that clock source.

Pseudo source 215 and pseudo target 220 have been introduced within clock domain 205. Within clock domain 205, nodes 225a–d represent clocked source registers while nodes 245a and 245b represent clocked target registers The pseudo sources, pseudo targets, and connections leading to and from any such pseudo nodes have been introduced for purposes of determining the delay for paths of the placed circuit. The pseudo nodes and connections leading to and from such nodes, do not contribute to the path delay or target delay calculation, for example such nodes and connections can be considered to contribute 0 signal propagation delay.

As paths having the highest path delay directly influence the frequency of the clock source or sources for a placed circuit design, those paths having the highest path delay can be called critical paths. Significant gains in placed circuit design performance can be achieved by reducing the path delays of such critical paths. As shown in timing graph 200, the path formed of nodes 215, 225a, 230, 240, 245a, and 220, referred to as path 3, includes connection A. Reducing the propagation delay of connection A, however, not only reduces the path delay of path 3, but also reduces the path delay of any other paths passing through connection A, for example the path formed of nodes 215, 225b, 235, 240, 245a, and 220.

Figure 3:
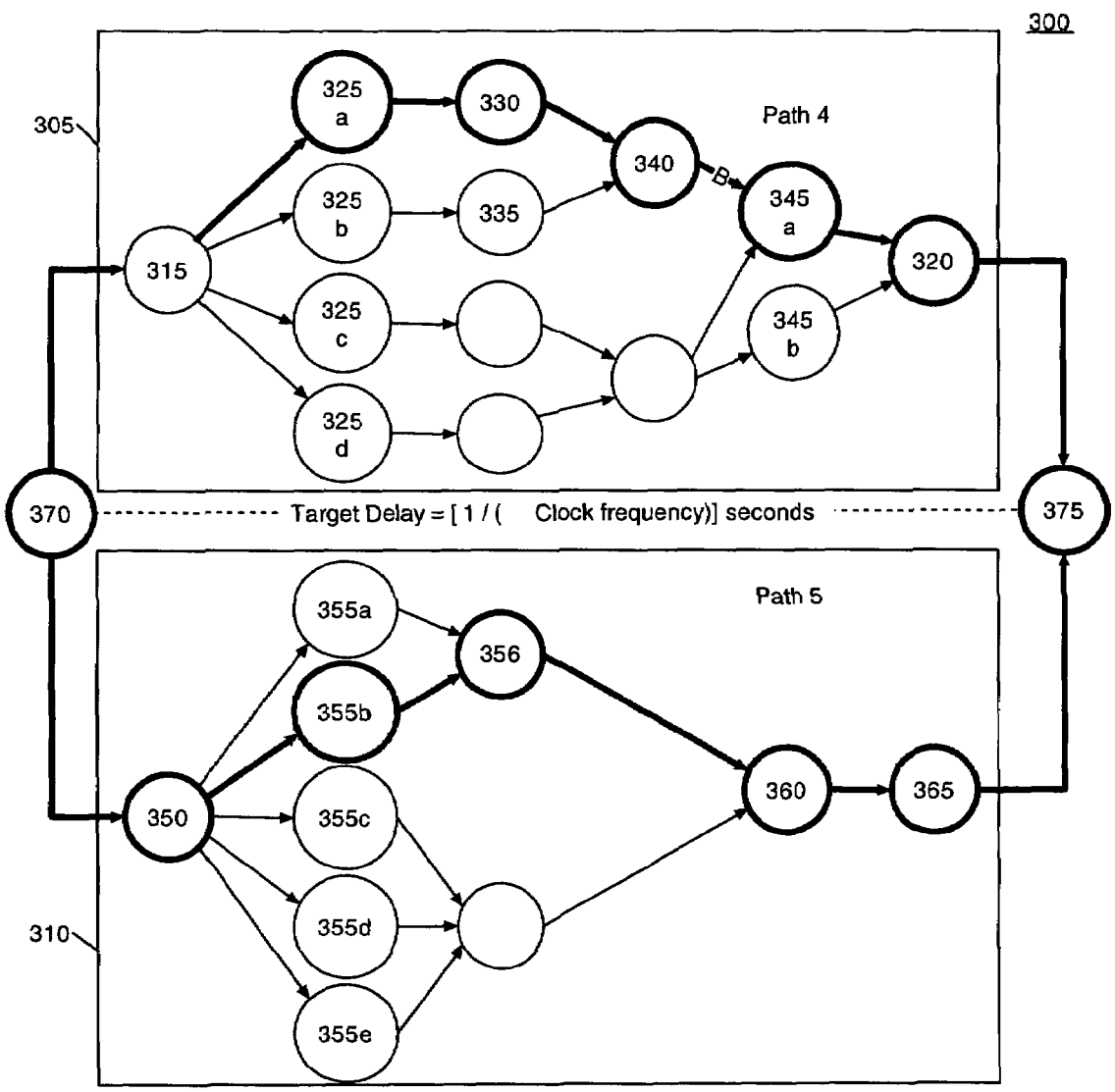
FIG. 3 is another timing graph representing a portion of a placed circuit design having multiple clock sources which have been constrained to a target frequency in accordance with yet another embodiment of the present invention.

FIG. 3 is another timing graph 300 representing a placed circuit design having two different clock sources (not shown). Accordingly, the timing graph 300 includes two clock domains 305 and 310, which have been constrained to operate at a same target frequency. In a preferred embodiment of the present invention there is a constraint in which all clock domains, e.g., clock domains 305 and 310, that the routing process (FIG. 4) is applied to, have the same frequency, i.e., the same target delays. Hence a "super" clock domain 300 is created having clock domains 305 and 310. As an example, path 4 formed of nodes 370, 315, 325a, 330, 340, 345a, 320, and 375, and path 5 formed of nodes 370, 350, 355b, 356, 360, 365, and 375 have the same target delay.

Pseudo source 315 and pseudo target 320 have been introduced within clock domain 305. Also within clock domain 305, nodes 325a–d represent clocked source registers while nodes 345a and 345b represent clocked target registers. Within clock domain 310, pseudo source 350 and pseudo target 365 have been introduced. Nodes 355a–e represent clocked source registers while node 360 represents a clocked target register. Finally, as each clock is constrained to the same target frequency, pseudo source 370 and pseudo target 375 have been introduced to form clock domain 300.

As shown in timing graph 300, the path formed of nodes 370, 315, 325a, 330, 340, 345a, 320, and 375, referred to as path 4, includes connection B. Reducing the propagation delay of connection B, similar to the case shown in FIG. 2, not only reduces the path delay of path 2, but also reduces the path delay of any other paths passing through connection B, for example the path formed of nodes 315, 325b, 335, 340, 345a, and 320. In an alternative embodiment clock domains 305 and 310 may have the same or different target delays and are treated separately, i.e., the flowchart of FIG. 4 is applied to clock domain 305 and separately to clock domain 310.

It should be appreciated that the timing graphs presented herein are provided for purposes of illustration only. Those skilled in the art will recognize that timing graphs for placed circuit designs can be significantly more complex, having a large number of connections, timing paths, nodes, as well as multiple clock sources. Accordingly, the various timing graphs disclosed herein are not intended as a limitation of the present invention to a particular type of placed circuit design, particular complexity level of placed circuit design, or to a class of placed circuit designs having a particular number of clock sources. Rather, the inventive arrangements disclosed herein can be applied to any of a variety of different placed circuit designs of varying complexities.

Figure 4:
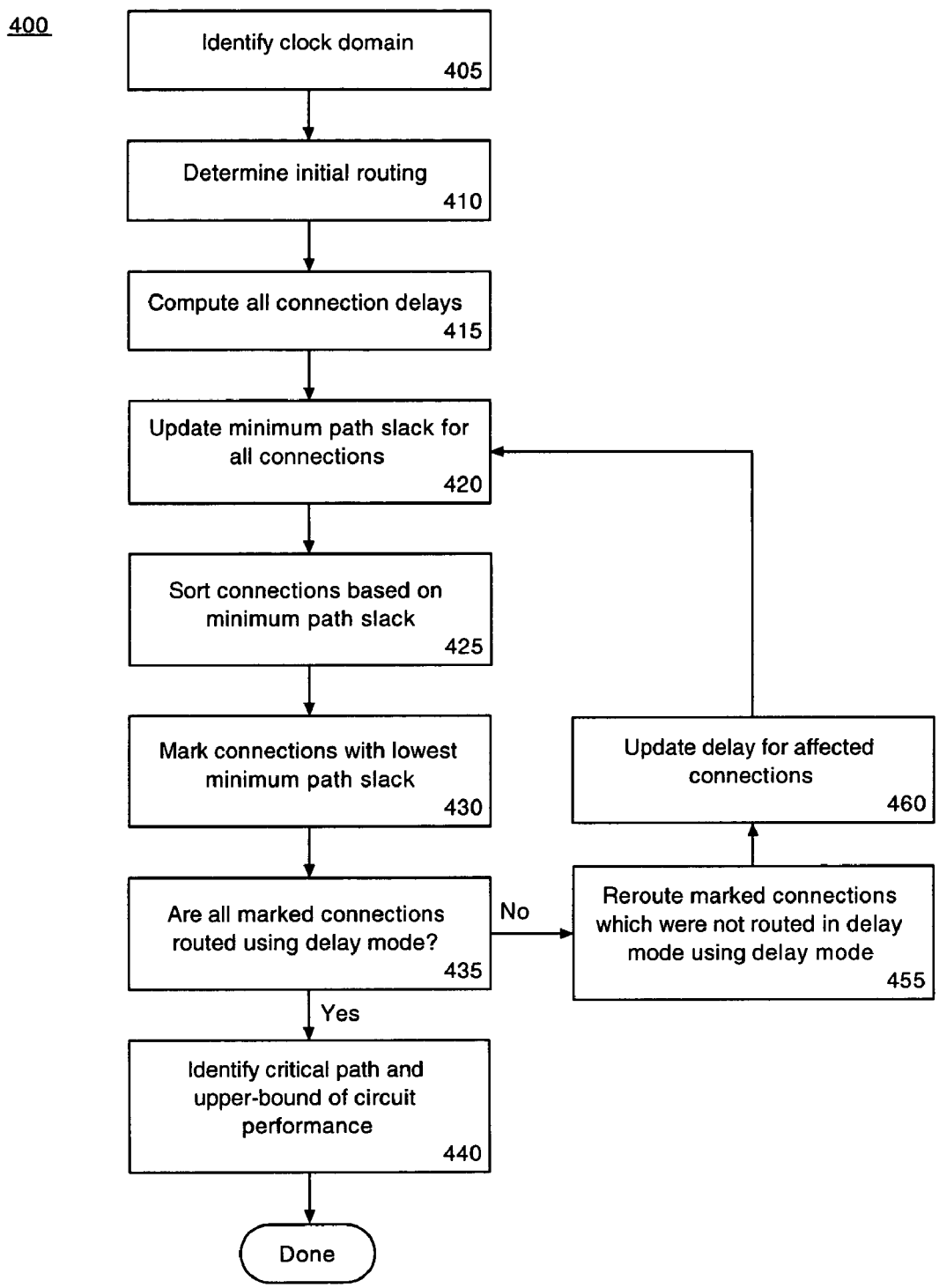
FIG. 4 is a flow chart illustrating a method of estimating an upper-bound for an operational frequency of a placed circuit design in accordance with another embodiment of the inventive arrangements disclosed herein.

FIG. 4 is a flow chart illustrating one embodiment of a method 400 for estimating an upper-bound of placed circuit design performance with respect to operating frequency. In one or more clock domains of a placed circuit design, the most critical paths, i.e. those with the lowest path slack, can be identified. Connections which are not routed in delay mode can be rerouted in delay mode. The number of connections routed in delay mode typically is a small percentage of connections of a given placed circuit design. By identifying and rerouting only those paths which have been identified as critical, significant time savings can be achieved for determining an estimate of upper-bound placed circuit performance.

The method 400 can begin in a state wherein a placed circuit design has been implemented using a CDA tool and a corresponding timing graph for the placed circuit design has been determined. For purposes of illustration, the method 400 will be described in the context of a placed circuit design having one or more clock sources which can be constrained to a particular target frequency. For example, any clock domains constrained to a same target frequency can be processed together, for instance as a single larger clock domain, while clock domains constrained to different target frequencies can be processed independently, i.e. as separate clock domains. As shown, the method 400 can begin in step 405 where a clock domain can be identified for processing.

In step 410, the initial routing of a placed circuit design can be determined. For example, design tools can be configured for performing automated routing functions for placed circuit designs. Typically, CDA tools can operate in any of several different modes such as a delay mode, wherein signals between nodes can be routed in a manner which minimizes the signal propagation delay for each connection, and a resource mode wherein signals between nodes are routed to minimize the number of wires or resources used for each connection. Resource mode does not minimize the propagation delay for a connection. Once a connection is routed in delay mode, however, that connection cannot be optimized any further in terms of propagation delay.

Thus, in step 410, the initial routing of the identified clock domain can be determined in resource mode with overlap, making the initial routing very fast. That is, each net can be routed physically without restrictions concerning shared resources. As noted, attempting to minimize the propagation delay for each connection can require a substantial amount of processing time. Thus, according to one embodiment of the present invention, the initial routing is performed using a routing mode which does not require a significant amount of processing time as selected paths and/or connections can be rerouted in accordance with the inventive arrangements disclosed herein.

In step 415, the delays for each path of the placed circuit design can be determined by the CDA tool. According to one embodiment of the present invention, the CDA tool can make one or more passes over the timing graph to determine path delays based upon timing information specified by logic and interconnect models.

In step 420, the minimum path slack can be calculated for each connection of the placed circuit design. The path slack refers to the difference between the target delay and the determined path delay. More particularly, the path slack for each path can be determined by subtracting the path delay of a path from the target delay. Notably, a path slack which is less than 0 indicates a path having a path delay greater than the target delay. Each connection can be assigned the path slack value of the path within which that connection is disposed. If more than one path runs through a given connection, that connection can be associated with a minimum path slack, which is the minimum of path slacks of any path passing through that connection.

In step 425, the connections can be sorted based upon minimum path slack. For example, the connections, or data objects representing the connections, can be added or stored within a data structure for processing and sorting. The connections can specify path delay and/or path slack as well as the particular routing mode used to route that connection. According to one embodiment of the present invention, the connections or connection data objects can be loaded into an array data structure. Still, any of a variety of different data structures can be used, for example to sort the connections. As such, the particular data structure used is not intended as a limitation of the present invention.

Accordingly, the data structure containing the connections can be sorted according to the path slack value of each connection from low to high. The connections associated with the lowest minimum path slack, and therefore, those connections associated with the path having the highest delay, can be readily identified after the connections are sorted within the data structure.

In step 430, the connections having the lowest minimum path slack values can be marked or identified as a set. As each connection of a particular path has a same path slack value, according to the inventive arrangements disclosed herein, the identification of each connection having the lowest minimum path slack value also identifies or specifies a complete path, particularly the path with the highest path delay, i.e. a critical path. Notably, more than one path can be identified as a critical path.

It should be appreciated that when a connection is not routed in delay mode, the reduction of the signal propagation delay caused by that connection can be achieved by rerouting the connection in delay mode. Any reductions in the propagation delay of that connection can lead to reductions in the path delay for all paths passing through that connection. Accordingly, an upper-bound of the operational frequency of the placed circuit design can be estimated by identifying paths having the highest path delay or the lowest minimum path slack, and selectively rerouting in delay mode any connections belonging to such paths which were not routed in delay mode.

In step 435, the marked connections can be examined to determine whether all of the marked connections were routed using delay mode. If all of the marked connections have been routed in delay mode, the method can proceed to step 440 as no other path or paths of the current clock domain can be further optimized. While the method 400 can proceed to process all connections, in practice, a critical path typically is located which already has each connection routed in delay mode without processing all connections. Such a path having the lowest minimum path slack, i.e. a critical path, defines the performance of the placed circuit design in terms of operational frequency. Accordingly, in step 440, the critical path can be identified and an estimate of the upper-bound performance of the clock domain in terms of operational frequency can be determined based upon the path delay of the critical path.

Continuing with step 455, in the case where one or more marked connections are not routed in delay mode, any such marked connections can be rerouted in delay mode. Although each marked connection can be rerouted in delay mode, it should be appreciated that all marked connections need not be rerouted. For example, one or more marked connections or any subset of the marked connections can be rerouted in delay mode. In step 460, the delay can be updated for the affected connections. That is, the delay can be recalculated for paths including rerouted connections.

Notably, although steps 455 and 460 are shown as being performed in serial fashion, it should be appreciated that according to one embodiment of the present invention, steps 455 and 460 can be iteratively performed in an interleaved fashion. For example, step 455 can be performed for one or more marked connections and then step 460 can be performed. The method then, if so configured, can loop back to step 455 to reroute additional marked connections and again proceed to step 460. In any case, after the path delays of the affected connections have been updated, the method can loop back to step 420 to repeat as necessary.

The method 400 discloses an iterative process wherein the looping structure can be controlled and terminated using any of a variety of different control mechanisms. According to one embodiment, an additional control mechanism can be included wherein a path slack threshold can be set such that as the lowest path slack of any path meets or exceeds the path slack threshold, the method can terminate. According to another embodiment of the present invention, an additional control mechanism can be included such that the method proceeds through only a predetermined number of iterations or processes a predetermined number of critical paths.

An exemplary embodiment of the present invention provides a method, system, and apparatus for generating a bound that provides a true upper-bound of placed circuit performance. Generally, each net can be routed independently. Routing independently refers to the notion that resources can be shared by different nets, a technique known as an overlap-tolerant solution. Overlap-tolerant solution results in some resources being shared by different nets which is an infeasible situation. However it is very quick, as it bypasses the time consuming overlap removal process.

While conventional techniques for determining an upper-bound of placed circuit performance have been limited to performing actual circuit routing using a delay mode where resources were not shared, the present invention provides a solution where resources can be shared. By allowing the sharing of resources, the present invention can determine an upper-bound estimate of placed circuit performance in significantly less time than conventional techniques of determining an upper-bound.

The upper-bound estimate determined according to the inventive arrangements disclosed herein provides a realistic bound. Typically, FPGAs are routed "resource rich" or non-overlap mode, in reference to the notion that if two critical nets are using the same routing resource, another similar routing resource likely will also be available. The present invention maintains the performance of the overlap-tolerant solution during the process of overlap removal or resource conflict resolution by addressing only the critical connections. As these critical connections typically form a small percentage of connections of an overall placed circuit design, the overlap-tolerant solution will be very close to an overlap-free, or delay mode, solution.

The present invention further provides a useful upper-bound in that the upper-bound can be calculated quickly. As the present invention entails routing nets independently and ignoring resource conflicts with other nets, an upper-bound can be predicted in much less time than is needed for determining a final, feasible or actual solution. The majority of time required for an actual or feasible router component to function corresponds to the delay aware overlap-removal or resource constraint violation removal process. The present invention avoids that process.

Reductions in the propagation delay of connections can lead to reductions in the path delay for any paths running through that connection. Accordingly, an upper-bound estimate of performance of the placed circuit design can be determined by identifying paths having the lowest path slack, and rerouting such connections which have not been routed using the delay mode of a computer design automation (CDA) tool. Accordingly, an upper-bound of placed circuit performance is reached when every connection of a critical path has been routed in delay mode. The present invention provides a generalized solution for estimating a realistic upper-bound of placed circuit performance that is independent of the algorithm or process implemented by the placed circuit design.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. Within a computer automated tool, a method of estimating an upper-bound for an operational frequency of at least a portion of a placed circuit design comprising:
    (a) identifying a clock source within the placed circuit design, wherein the clock source is associated with a clock domain;
    (b) determining an initial routing of connections of the clock domain;
    (c) determining a minimum path slack corresponding to each connection of the clock domain;
    (d) selecting the connections based on minimum path slack; and
    (e) routing one or more of the selected connections in delay mode.

2. The method of claim 1, further comprising:
    (f) marking the connections of the clock domain which have a lowest minimum path slack; and
    (g) identifying marked connections which are not routed in delay mode as selected.

3. The method of claim 2, wherein the connections having the lowest minimum path slack correspond to a critical path, said method further comprising:
    (h) determining an upper-bound estimate of clock frequency for said clock domain as defined by a path delay of the critical path.

4. The method of claim 1, wherein the initial routing is performed in an overlap tolerant resource mode.

5. The method of claim 1, said step (c) further comprising:
    assigning to each connection the path slack of the path within which the connection is disposed.

6. The method of claim 5, further comprising:
    if more than one path passes through the connection, assigning to the connection the minimum path slack of all paths passing through the connection.

7. The method of claim 1, said step (d) further comprising:
    populating a data structure with the connections of the clock domain; and
    sorting the connections according to the path slack of each connection.

8. The method of claim 3, further comprising:
    iteratively applying steps (a)–(h) to different clock sources of the placed circuit design, wherein each different clock source is associated with a corresponding and different clock domain.

9. Within a computer automated tool, a method of estimating an upper-bound of an operational frequency of at least a portion of a placed circuit design comprising:
    (a) constraining at least two clock sources within the placed circuit design to a same target frequency, wherein each clock source is associated with a different clock domain;
    (b) determining an initial routing of connections of the clock domains;
    (c) determining a minimum path slack corresponding to each connection of the plurality of clock domains;
    (d) marking connections of the plurality of clock domains which have a lowest minimum path slack;
    (e) identifying marked connections which are not routed in delay mode; and (f) routing one or more of the identified connections in delay mode.

10. The method of claim 9, further comprising:
(g) repeating steps (c)–(f) until all marked connections are routed in delay mode.

11. The method of claim 10, wherein the connections having the lowest minimum path slack correspond to a critical path, said method further comprising:
determining an upper-bound estimate of clock frequency for the clock domains as defined by a path delay of the critical path.

12. The method of claim 10, wherein the initial routing is performed in an overlap-tolerant resource mode.

13. The method of claim 10, said step (c) further comprising:
assigning to each connection the path slack of the path within which the connection is disposed.

14. The method of claim 13, further comprising:
if more than one path passes through the connection, assigning to the connection the minimum path slack of all paths passing through the connection.

15. The method of claim 10, said step (d) further comprising:
populating a data structure with the connections of the plurality of clock domains; and
sorting the connections according to the path slack of each connection.

16. A machine readable storage, having stored thereon a computer program having a plurality of code sections executable by a machine for causing the machine to perform the steps of:
(a) identifying a clock source within a placed circuit design, wherein the clock source is associated with a clock domain;
(b) determining an initial routing of connections of the clock domain;
(c) determining a minimum path slack corresponding to each connection of the clock domain;
(d) marking connections of the clock domain which have a lowest minimum path slack;
(e) identifying marked connections which are not routed in delay mode; and
(f) routing one or more of the identified connections in delay mode.

17. The machine readable storage of claim 16, further comprising:
(g) repeating steps (c)–(f) until all marked connections are routed in delay mode.

18. The machine readable storage of claim 17, wherein the connections having the lowest minimum path slack correspond to a critical path, said machine readable storage further causing the machine to perform the step of:
(h) determining an upper-bound estimate of clock frequency for said clock domain as defined by a path delay of the critical path.

19. The machine readable storage of claim 16, wherein initial routing is performed in a resource mode.

20. The machine readable storage of claim 16, said step (c) further comprising:
assigning to each connection the path slack of the path within which the connection is disposed.

21. The machine readable storage of claim 20, further comprising:
if more than one path passes through the connection, assigning to the connection the minimum path slack of all paths passing through the connection.

22. The machine readable storage of claim 16, said step (d) further comprising:
populating a data structure with the connections of the clock domain; and
sorting the connections according to the path slack of each connection.

23. The machine readable storage of claim 18, further comprising:
iteratively applying steps (a)–(h) to different clock sources of the placed circuit design, wherein each different clock source is associated with a corresponding and different clock domain.

24. A machine readable storage, having stored thereon a computer program having a plurality of code sections executable by a machine for causing the machine to perform the steps of:
(a) constraining at least two clock sources within a placed circuit design to a same target frequency, wherein each clock source is associated with a different clock domain;
(b) determining an initial routing of connections of the clock domains;
(c) determining a minimum path slack corresponding to each connection of the plurality of clock domains;
(d) marking connections of the plurality of clock domains which have a lowest minimum path slack;
(e) identifying marked connections which are not routed in delay mode; and
(f) routing one or more of the identified connections in delay mode.

25. The machine readable storage of claim 24, further comprising:
(g) repeating steps (c)–(f) until all marked connections are routed in delay mode.

26. The machine readable storage of claim 25, wherein the connections having the lowest minimum path slack correspond to a critical path, said machine readable storage further causing the machine to perform the step of:
determining an upper-bound estimate of clock frequency for the clock domains as defined by a path delay of the critical path.

27. The machine readable storage of claim 24, wherein the initial routing is performed in an overlap-tolerant mode.

28. The machine readable storage of claim 24, said step (c) further comprising:
assigning to each connection the path slack of the path within which the connection is disposed.

29. The machine readable storage of claim 28, further comprising:
if more than one path passes through the connection, assigning to the connection the minimum path slack of all paths passing through the connection.

30. The machine readable storage of claim 29, said step (c) further comprising:
populating a data structure with the connections of the plurality of clock domains; and
sorting the connections according to the path slack of each connection.

31. A system configured to estimate an upper-bound of an operational frequency of at least a portion of a placed circuit design, comprising:
(a) means for identifying a clock source within the placed circuit design, wherein the clock source is associated with a clock domain;
(b) means for determining an initial routing of connections of the clock domain;

(c) means for determining a minimum path slack corresponding to each connection of the clock domain;
(d) means for marking connections of the clock domain which have a lowest minimum path slack;
(e) means for identifying marked connections which are not routed in delay mode;
(f) means for routing one or more of the identified connections in delay mode; and
(g) means for repeating steps (c)–(f) until all marked connections are routed in delay mode.

32. The system of claim 31, wherein the connections having the lowest minimum path slack correspond to a critical path, said system further comprising:
means for determining an upper-bound estimate of clock frequency for the clock domain as defined by a path delay of the critical path.

33. A system configured to estimate an upper-bound of an operational frequency of at least a portion of a placed circuit design, comprising:
(a) means for constraining at least two clock sources within the placed circuit design to a same target frequency, wherein each clock source is associated with a different clock domain;
(b) means for determining an initial routing of connections of the clock domains;
(c) means for determining a minimum path slack corresponding to each connection of the plurality of clock domains;
(d) means for marking connections of the plurality of clock domains which have a lowest minimum path slack;
(e) means for identifying marked connections which are not routed in delay mode;
(f) means for routing one or more of the identified connections in delay mode; and
(g) means for repeating steps (c)–(f) until all marked connections are routed in delay mode.

34. The system of claim 33, wherein the connections having the lowest minimum path slack correspond to a critical path, said system further comprising:
means for determining an upper-bound estimate of clock frequency for the clock domains as defined by a path delay of the critical path.

* * * * *